United States Patent
Lee

(10) Patent No.: US 7,659,787 B2
(45) Date of Patent: Feb. 9, 2010

(54) CIRCUIT FOR GENERATING CLOCK OF SEMICONDUCTOR MEMORY APPARATUS

(75) Inventor: Sang-Kyu Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 47 days.

(21) Appl. No.: 11/826,813

(22) Filed: Jul. 18, 2007

(65) Prior Publication Data
US 2008/0136486 A1 Jun. 12, 2008

(30) Foreign Application Priority Data
Dec. 7, 2006 (KR) .............. 10-2006-0123583

(51) Int. Cl.
*H03L 1/00* (2006.01)
(52) U.S. Cl. .............. 331/176; 331/15; 331/16; 331/185; 327/291
(58) Field of Classification Search ............... 331/66, 331/111, 143, 176, 185, 186
See application file for complete search history.

(56) References Cited

U.S. PATENT DOCUMENTS

| | | | |
|---|---|---|---|
| 5,666,046 A * | 9/1997 | Mietus | 323/313 |
| 5,703,513 A | 12/1997 | Hashizume et al. | |
| 5,870,345 A | 2/1999 | Stecker | |
| 5,926,434 A | 7/1999 | Mori | |
| 6,232,811 B1 | 5/2001 | Ihm | |
| 6,356,161 B1 * | 3/2002 | Nolan et al. | 331/176 |
| 6,529,423 B1 | 3/2003 | Yoon et al. | |
| 2005/0285666 A1 * | 12/2005 | Garlapati et al. | 327/539 |
| 2006/0097813 A1 * | 5/2006 | Won | 331/185 |

FOREIGN PATENT DOCUMENTS

JP 9074337 3/1997

* cited by examiner

*Primary Examiner*—Joseph Chang
*Assistant Examiner*—Jeffrey Shin
(74) *Attorney, Agent, or Firm*—Venable LLP; Jeffri A. Kaminski

(57) ABSTRACT

A circuit for generating a clock of a semiconductor memory apparatus is provided. A reference voltage generator is configured to generate a reference voltage. A reference current generator is configured to generate a reference current that has a constant current value regardless of a change in temperature. An oscillator is configured to receive the reference voltage and the reference current to generate a clock that has constant frequency.

18 Claims, 6 Drawing Sheets

CIRCUIT FOR GENERATING CLOCK OF SEMICONDUCTOR MEMORY APPARATUS

CROSS-REFERENCE TO RELATED PATENT APPLICATION

This application claims the benefit of Korean Patent Application No. 10-2006-0123583, filed on Dec. 7, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and more particularly, to a circuit for generating a clock of a semiconductor memory apparatus.

2. Related Art

In general, as shown in FIG. 1, a circuit for generating a clock of a semiconductor memory apparatus includes a resistor R1, a capacitor C1, and a Schmitt trigger 1. A resistance of the resistor R1 changes according to temperature. A threshold voltage of a transistor that constitutes the Schmitt trigger 1 changes according to temperature. Therefore, the frequency of a clock clk that is output by the circuit for generating a clock according to the related art changes according to temperature.

The clock clk output by the circuit for generating a clock according to the related art changes in a range of approximately 10 to 15% when temperature changes from 15 degrees below zero to 100 degrees above zero. The semiconductor memory apparatus that is designed according to the clock clk having predetermined frequency performs an erroneous operation when the frequency of the clock clk changes.

SUMMARY OF THE INVENTION

Embodiments of the present invention provide a circuit for generating a clock of a semiconductor memory apparatus that prevents a clock frequency from changing according to temperature.

An embodiment of the present invention provides a circuit for generating a clock of a semiconductor memory apparatus. The circuit includes a reference voltage generator that generates a reference voltage, a reference current generator that generates a reference current that has a constant current value regardless of a change in temperature, and an oscillator that is supplied with the reference voltage and the reference current to generate a clock that has constant frequency.

DESCRIPTION OF EXEMPLARY EMBODIMENT

An exemplary embodiment of the present invention will now be described in detail with reference to the accompanying drawings.

Figure 1:
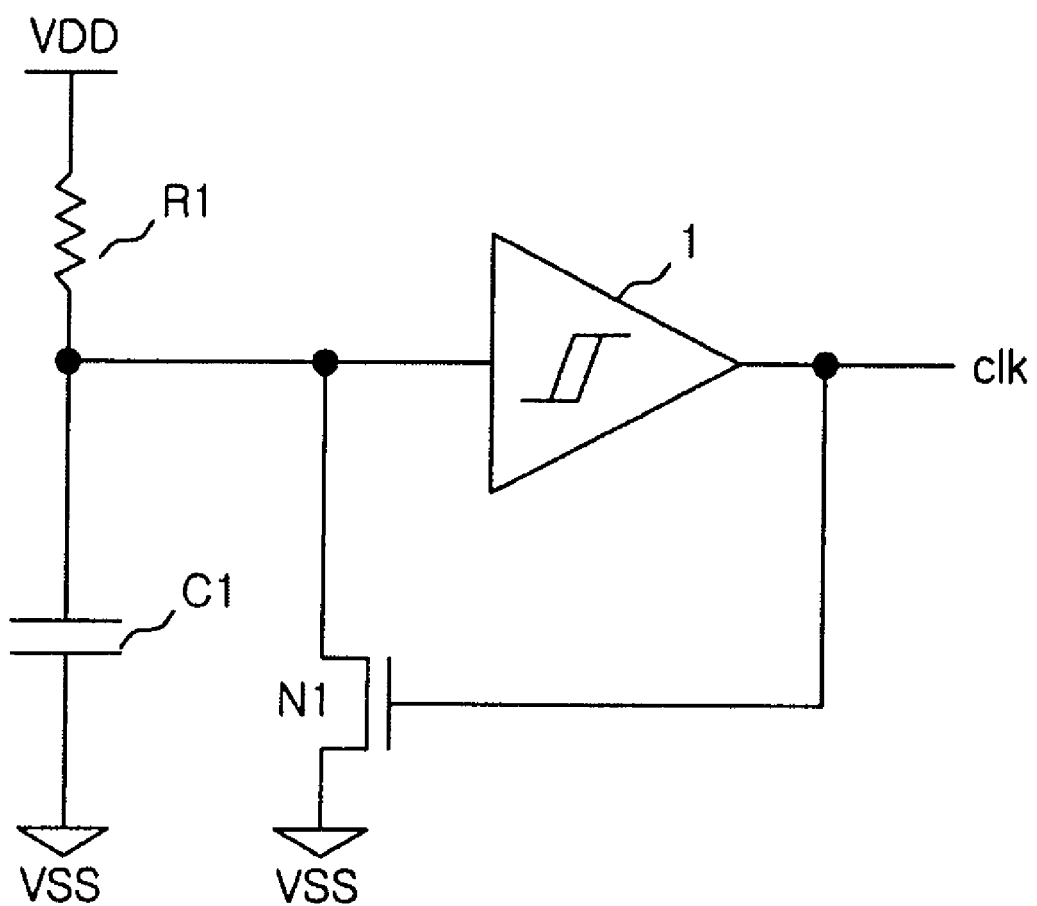
FIG. 1 is a circuit diagram illustrating a circuit for generating a clock of a semiconductor memory apparatus according to the related art.
Figure 2:
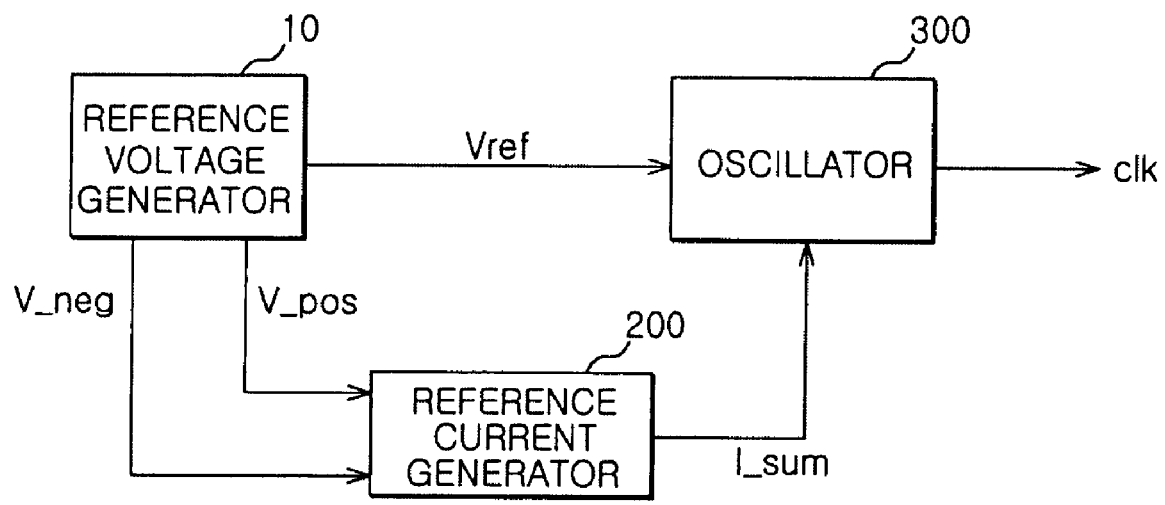
FIG. 2 is a block diagram illustrating a circuit for generating a clock of a semiconductor memory apparatus according to an embodiment of the present invention.

Referring to FIG. 2, a circuit for generating a clock of a semiconductor memory apparatus includes a reference voltage generator 10, a reference current generator 200, and an oscillator 300.

The reference voltage generator 10 generates a reference voltage Vref that is not affected by a change in temperature by using a positive temperature coefficient voltage V_pos whose voltage level increases as the temperature increases and a negative temperature coefficient voltage V_neg whose voltage level decreases as the temperature increases.

The reference current generator 200 converts the positive temperature coefficient voltage V_pos into a positive temperature coefficient current, and the negative temperature coefficient voltage V_neg into a negative temperature coefficient current, and then generates a reference current I_sum that is obtained by summing up the positive and negative temperature coefficient currents.

The oscillator 300 flows the reference current I_sum into a capacitor so as to charge the capacitor with electric charges. When a level of the voltage charged in the capacitor is higher than that of the reference voltage Vref, the oscillator 300 discharges the capacitor. That is, the oscillator 300 determines the frequency of a clock clk according to charging and discharging times of the capacitor.

Figure 3:
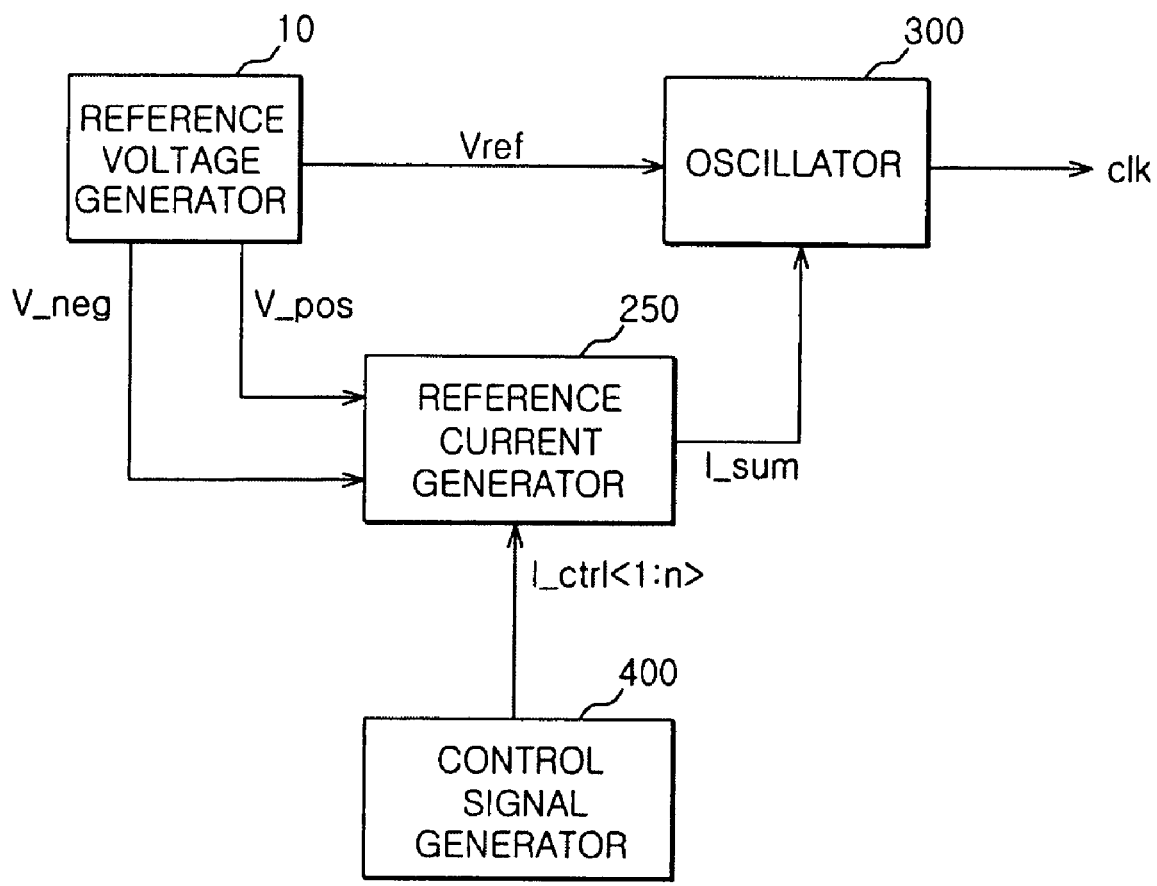
FIG. 3 is a block diagram illustrating a circuit for generating a clock of a semiconductor memory apparatus according to another embodiment of the present invention.

Further, as shown in FIG. 3, the circuit for generating a clock of the semiconductor memory apparatus may further include a control signal generator 400.

As shown in FIG. 3, when the circuit for generating a clock includes the control signal generator 400, a reference current generator 250 converts the positive temperature coefficient voltage V_Pos into a positive temperature coefficient current, and the negative temperature coefficient voltage V_neg into a negative temperature coefficient current so as to generate a reference current I_sum that is not affected by a change in temperature. Here, the amount of reference current I_sum is determined according to a plurality of current control signals I_ctrl<1:$n$>.

The control signal generator 400 generates the plurality of current control signals I_ctrl<1:n>. Whether the current control signals I_ctrl<i> are activated or not is determined according to connection statuses of fuses.

The oscillator 300 flows the reference current I_sum into a capacitor to thereby charge the capacitor with electric charges. When a level of the voltage charged in the capacitor is higher than that of the reference voltage Vref, the oscillator 300 discharges the capacitor and generates the clock clk.

Figure 4:
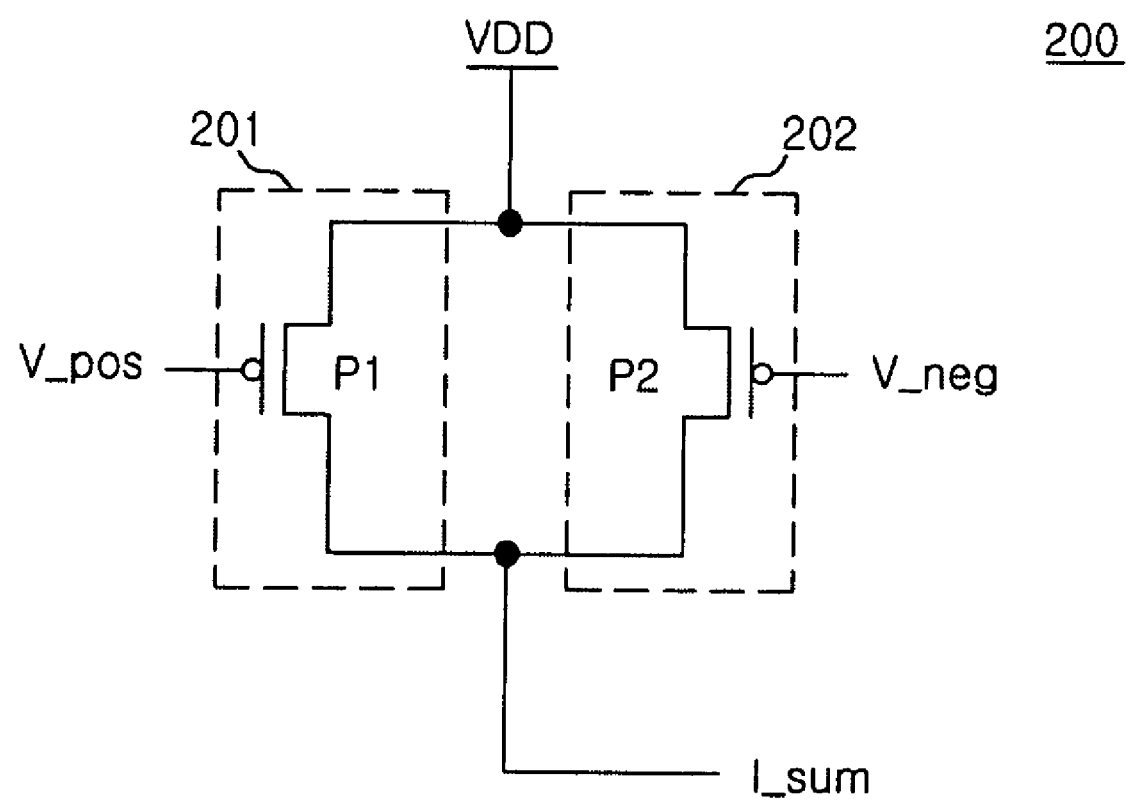
FIG. 4 is a circuit diagram illustrating the embodiment of a reference current generator shown in FIG. 2.

When the control signal generator 400 is not provided, as shown in FIG. 4, the reference current generator 200 includes a first converting unit 201 and a second converting unit 202.

The first converting unit 201 is applied with the positive temperature coefficient voltage V_pos of the reference voltage generator 10.

The first converting unit 201 includes a first transistor P1 that includes a gate to which the positive temperature coefficient voltage V_pos is applied, a source to which an external voltage VDD is applied, and a drain that is an output terminal of the first converting unit 201. At this time, the amount of current passing through the first transistor P1 is controlled according to a voltage level of the gate.

The second converting unit 202 is applied with the negative temperature coefficient voltage V_neg of the reference voltage generator 10.

The second converting unit 202 includes a second transistor P2 that includes a gate to which the negative temperature coefficient voltage V_neg is applied, a source to which the external voltage VDD is applied, and a drain that is connected to an output terminal of the second converting unit 202. At this time, the amount of current passing through the second transistor P2 is controlled according to a voltage level of the gate.

The reference current I_sum is output from a node at which the output terminals of the first converting unit 201 and the second converting unit 202 are connected to each other. When the temperature increases, a voltage level of the positive temperature coefficient voltage V_pos increases, and the amount of current that is output from the first converting unit 201 is reduced. Meanwhile, when the temperature increases, a voltage level of the negative temperature coefficient voltage V_neg decreases, and the amount of current that is output from the second converting unit 202 increases. Therefore, regardless of a change in temperature, a predetermined amount of current, that is, the reference current I_sum is output from the node at which the output terminals of the first converting unit 201 and the second converting unit 202 are connected to each other.

Figure 5:
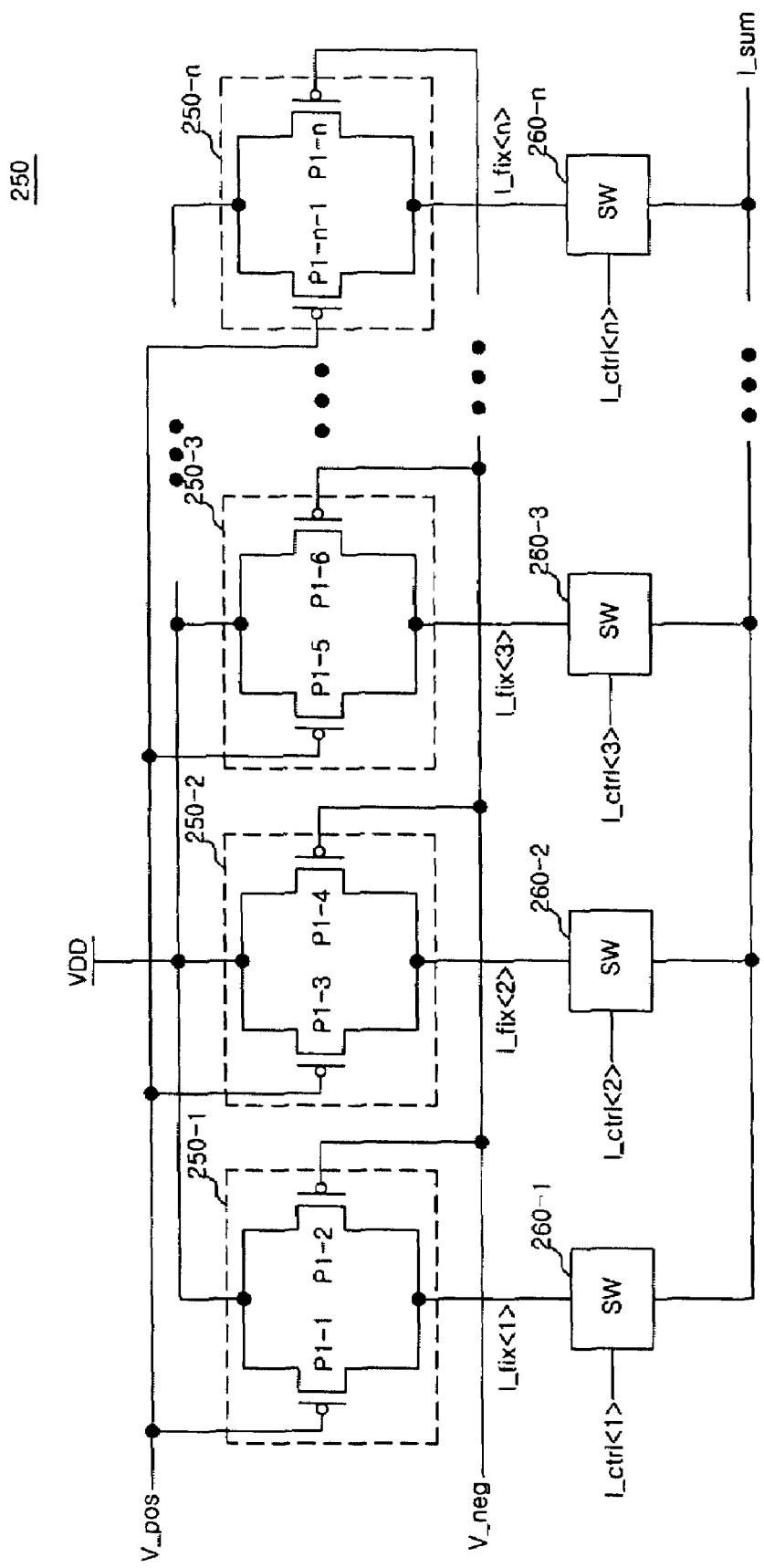
FIG. 5 is a circuit diagram illustrating the embodiment of a reference current generator shown in FIG. 3.

Meanwhile, as shown in FIG. 3, when the control signal generator 400 is included, the reference current generator 250 includes a plurality of fixed current generating units 250-1 to 250-n and a plurality of switching units 260-1 to 260-n, as shown in FIG. 5.

Each of the plurality of fixed current generating units 250-1 to 250-n receives the positive temperature coefficient voltage V_pos and the negative temperature coefficient voltage V_neg of the reference voltage generator 10, and generates a fixed current I_fix<1:n> that has a constant current value regardless of a change in temperature.

Since the plurality of fixed current generating units 250-1 to 250-n have the same structures, a description will be made by exemplifying the first fixed current generating unit 250-1.

The first fixed current generating unit 250-1 includes a third transistor P1-1 and a fourth transistor P1-2. The third transistor P1-1 includes a gate to which the positive temperature coefficient voltage V_pos is applied and a source to which the external voltage VDD is applied. The fourth transistor P1-2 includes a gate to which the negative temperature coefficient voltage V_neg is applied, a source to which the external voltage VDD is applied, and a drain connected to a drain of the third transistor P1-1. A first fixed current I_fix<1> is outputted from a node at which the third transistor P1-1 and the fourth transistor P1-2 are connected to each other.

Each of the plurality of switching units 260-1 to 260-n outputs the corresponding fixed current I_fix<1:n> as the reference current I_sum in response to the plurality of current control signals I_ctrl<1:n>. The plurality of switching units 260-1 to 260-n include output terminals that are connected to one output node so as to output the reference current I_sum. At this time, the switching units 260-1 to 260-n may be realized by using transistors. Further, a current value of the reference current I_sum changes according to how many switching units are turned on among the plurality of switching units 260-1 to 260-n.

Figure 6:
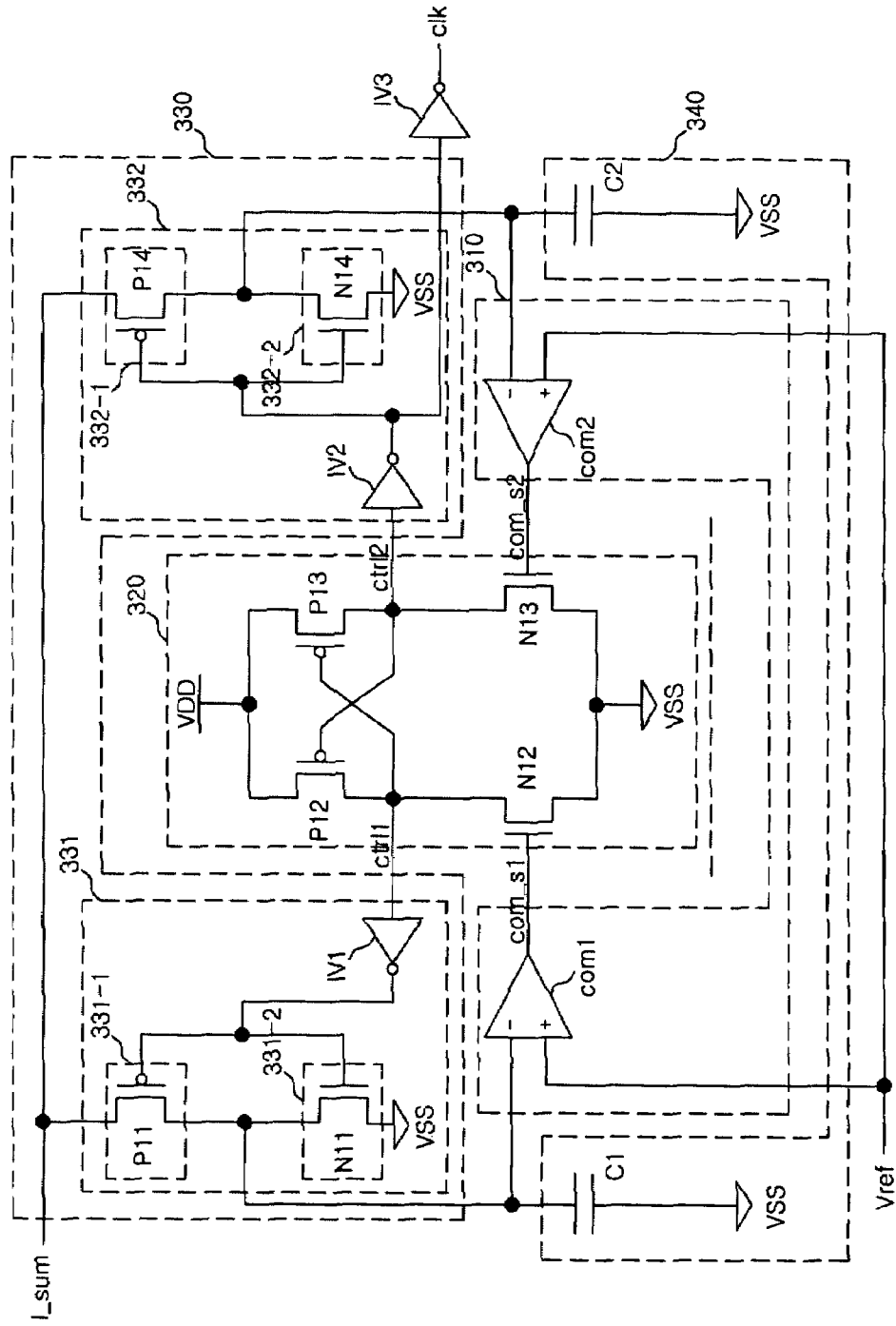
FIG. 6 is a circuit diagram illustrating the embodiment of an oscillator shown in FIGS. 2 and 3.

As shown in FIG. 6, the oscillator 300 includes an electric charge charging unit 340, a comparing unit 310, a control signal generating unit 320, and a control unit 330.

The electric charge charging unit 340 includes a first capacitor C1 and a second capacitor C2. The first capacitor C1 includes one end to which an output signal of the control signal generating unit 310, that is, a first control signal ctrl1 is input, and the other end connected to a ground terminal VSS. The second capacitor C2 includes one end to which an output signal of the control signal generating unit 310, that is, a second control signal ctrl2 is input and the other end connected to a ground terminal VSS.

The comparing unit 310 compares a voltage level of the reference voltage Vref with a voltage level of the voltage stored in the first capacitor C1 and a voltage level of the voltage stored in the second capacitor C2, and then generates a first comparison signal com_s1 and a second comparison signal com_s2, respectively.

The comparing unit 310 includes first and second comparators com1 and com2. The first comparator com1 compares the voltage level of the voltage stored in the first capacitor C1 with the voltage level of the reference voltage Vref, and generates the first comparison signal com_s1. The second comparator com2 compares the voltage level of the voltage stored in the second capacitor C2 with the voltage level of the reference voltage Vref, and generates the second comparison signal com_s2.

The control signal generating unit 320 compares a level of the first comparison signal com_s1 with a level of the second comparison signal com_s2 and generates the first control signal ctrl1 and the second control signal ctrl2. For example, when the level of the first comparison signal com_s1 is higher than that of the second comparison signal com_s2, the control signal generating unit 320 outputs the first control signal ctrl1 at a low level and the second control signal ctrl2 at a high level. When the level of the first comparison signal com_s1 is lower than that of the second comparison signal com_s2, the control signal generating unit 320 outputs the first control signal ctrl1 at a high level and the second control signal ctrl2 at a low level. At this time, the control signal generating unit 320 has a structure of a comparator.

The control signal generating unit 320 includes a fifth transistor N12, a sixth transistor N13, a seventh transistor P12, and an eighth transistor P13. The fifth transistor N12 includes a gate to which the first comparison signal com_s1 is input and a source connected to a ground terminal VSS. The sixth transistor N13 includes a gate to which the second comparison signal com_s2 is input and a source connected to the ground terminal VSS. The seventh transistor P12 includes a source to which the external voltage VDD is applied, a gate connected to a drain of the sixth transistor N13, and a drain connected to a drain of the fifth transistor N12. The eighth transistor P13 includes a source to which the external voltage VDD is applied, a gate connected to the drain of the fifth transistor N12, and a drain connected to the drain of the sixth transistor N13. At this time, the control signal generating unit 320 outputs the first control signal ctrl1 from a node at which the fifth transistor N12 and the seventh transistor P12 are connected to each other, and the second control signal ctrl2 from a node at which the sixth transistor N13 and the eighth transistor P13 are connected to each other.

The control unit 330 controls the charging and discharging of the first and second capacitors C1 and C2 in response to the first control signal ctrl1 and the second control signal ctrl2.

The control unit 330 includes a first capacitor control unit 331 and a second capacitor control unit 332.

The first capacitor control unit 331 controls the charging and discharging of the first capacitor C1 in response to the first control signal ctrl1.

The first capacitor control unit 331 includes a first inverter IV1, a first charging unit 331-1, and a first discharging unit 331-2.

The first inverter IV1 inverts and outputs the first control signal ctrl1.

The first charging unit 331-1 controls the charging of the first capacitor C1 in response to an output signal of the first inverter IV1.

The first charging unit 331-1 outputs the reference current I_sum to the one end of the first capacitor C1 in response to the output signal of the first inverter IV1, thereby controlling the charging of the first capacitor C1.

The first charging unit 331-1 includes a ninth transistor P11 that includes a gate to which the output signal of the first inverter IV1 is input, a source to which the reference current I_sum is input, and a drain connected to an output terminal of the first discharging unit 331-2.

The first discharging unit 331-2 connects the one end of the first capacitor C1 to the ground terminal VSS in response to the output signal of the first inverter IV1, thereby controlling the discharging of the first capacitor C1.

The first discharging unit 331-2 includes a tenth transistor N11 that includes a gate to which the output signal of the first inverter IV1 is input, a source connected to the ground terminal VSS, and a drain connected to the first charging unit 331-1.

At this time, a node at which the ninth transistor P11 and the tenth transistor N11 are connected to each other, that is, a node at which the first charging unit 331-1 and the first discharging unit 331-2 are connected to each other is an output terminal of the first capacitor control unit 331.

The second capacitor control unit 332 controls the charging and discharging of the second capacitor C2 in response to the second control signal ctrl2.

The second capacitor control unit 332 includes a second inverter IV2, a second charging unit 332-1, and a second discharging unit 332-2.

The second inverter IV2 inverts and outputs the second control signal ctrl2.

The second charging unit 332-1 controls the charging of the second capacitor C2 according to an output signal of the second inverter IV2.

The second charging unit 332-1 outputs the reference current I_sum to one end of the second capacitor C2 in response to the output signal of the second inverter IV2, thereby controlling the charging of the second capacitor C2.

The second charging unit 332-1 includes an eleventh transistor P14 that includes a gate to which the output signal of the second inverter IV2 is input, a source to which the reference current I_sum is input, and a drain connected to an output terminal of the second discharging unit 332-2.

The second discharging unit 332-2 connects the one end of the second capacitor C2 to the ground terminal VSS in response to the output signal of the second inverter IV2, thereby controlling discharging of the second capacitor C2.

The second discharging unit 332-2 includes a twelfth transistor N14 that includes a gate to which the output signal of the second inverter IV2 is input, a source connected to a ground terminal VSS, and a drain connected to the second charging unit 332-1.

At this time, a node at which the eleventh transistor P14 and the twelfth transistor N14 are connected to each other, that is, a node at which the second charging unit 332-1 and the second discharging unit 332-2 are connected to each other is an output terminal of the second capacitor control unit 332.

The oscillator 300 further includes a third inverter IV3. The third inverter IV3 includes an input terminal to which the output signal of the second inverter IV2 is input, and an output terminal from which the clock clk is output.

The operation of the circuit for generating a clock that has the above-described structure is performed as described below.

In the oscillator 300, when the external voltage VDD is supplied to start the driving of the semiconductor memory apparatus, one of the seventh transistor P12 or the eighth transistor P13 of the control signal generating unit 320 is turned on before the other of the seventh transistor P12 or the eighth transistor P13. This is because the seventh transistor P12 and the eighth transistor P13 have different threshold voltages from each other due to processing reasons, even though they have the same size. Therefore, the operation will be described on the assumption that the eighth transistor P13 is turned on before the seventh transistor P12.

When the eighth transistor P13 is turned on, the second control signal ctrl2 is output at a high level, and the twelfth transistor N14 of the second capacitor control unit 332 is turned on and outputs the reference current I_sum. At this time, the clock clk is at a high level.

The second capacitor C2 that is applied with the reference current I_sum is charged with electric charges. When a level of the voltage charged in the second capacitor C2 is higher than that of the reference voltage Vref, the second comparator com2 outputs the second comparison signal com_s2 at a high level. Then, the sixth transistor N13 is turned on, and the second control signal ctrl2 is transited to a low level. At this time, the clock clk is also transited to a low level.

The second capacitor control unit 332 receives the second control signal ctrl2 at a low level, and the eleventh transistor P14 is turned on. As a result, the charges charged in the second capacitor C2 are discharged by the eleventh transistor P14. The second comparator com2 outputs the second comparison signal com_s2 at a low level to turn off the sixth transistor N13.

Further, when the second control signal ctrl2 is transited to the low level, the seventh transistor P12 is turned on, the first control signal ctrl1 is transited to a high level, and the first capacitor control unit 331 charges the first capacitor C1. When the voltage level of the voltage charged in the first capacitor C1 is higher than that of the reference voltage Vref, the first comparator com1 outputs the first comparison signal com_s1 at a high level and the first control signal ctrl1 is transited to a low level.

That is, the first capacitor C1 and the second capacitor C2 are designed such that when one of the first and second capacitors C1 and C2 performs the charging or discharging operation, the other capacitor performs the other of the discharging or charging operation.

In order that the oscillator 300 maintains the constant frequency of the clock clk regardless of a change in temperature, the reference current I_sum that is used to charge the first and second capacitors C1 and C2 needs to have a constant current value regardless of temperature. Therefore, each of the reference current generators 200 and 250 generates the reference current I_sum by using the positive temperature coefficient voltage V_pos whose voltage level increases when the temperature increases and the negative temperature coefficient voltage V_neg whose voltage level decreases when the temperature increases. Further, the current value of the reference current I_sum is not changed even though the reference current I_sum passes through the transistors, such that the capacitor can be charged and discharged at a constant speed at all times. Furthermore, in this embodiment of the present invention, the current value of the reference current I_sum can be changed in response to the current control signals I_ctrl<1:n> due to the processing reasons or a change in the current value of the reference current I_sum.

As described above, the circuit for generating a clock of the semiconductor memory apparatus according to one embodiment of the present invention generates the clock that has constant frequency regardless of the change in temperature, such that the operation of the semiconductor memory apparatus can be stably performed.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A circuit for generating a clock of a semiconductor memory apparatus, the circuit comprising:
    a reference voltage generator configured to generate a reference voltage;
    a reference current generator configured to generate a plurality of fixed currents, each of which has a constant current value regardless of a change in temperature, the reference current generator including a plurality of switching units outputting the plurality of fixed currents respectively to output terminals, the output terminals being connected in common to output a reference current;
    an oscillator configured to receive the reference voltage and the reference current to generate a clock that has constant frequency;
    a control signal generator configured to determine a current value of the reference current by controlling the reference current generator, wherein the reference current generator further comprises:
    a plurality of fixed current generating units, each of which is configured to receive a positive temperature coefficient voltage and a negative temperature coefficient voltage of the reference voltage generator to generate the fixed current that has a constant current value regardless of temperature; and
    wherein the switching units are configured to output the plurality of fixed currents in response to the plurality of current control signals.

2. The circuit of claim 1,
wherein the oscillator is configured to generate the clock using charging and discharging times of a capacitor.

3. The circuit of claim 2,
wherein the oscillator is configured to generate the clock by providing the reference current to the capacitor to accumulate electric charges in the capacitor and discharging the capacitor when a level of the voltage accumulated in the capacitor is higher than that of the reference voltage.

4. The circuit of claim 1,
wherein the oscillator comprises:
an electric charge charging unit comprising a first capacitor and a second capacitor;
a comparing unit configured to compare a voltage level of the reference voltage with a voltage level of a voltage stored in the first capacitor and a voltage level of a voltage stored in the second capacitor so as to generate a first comparison signal and a second comparison signal, respectively;

a control signal generating unit configured to generate a first control signal and a second control signal in response to the first comparison signal and the second comparison signal, respectively; and
a control unit configured to receive the first control signal and the second control signal to control the charging and discharging of the first capacitor and the second capacitor.

5. The circuit of claim 4,
wherein the comparing unit comprises:
a first comparator configured to compare the voltage stored in the first capacitor with the reference voltage to generate the first comparison signal; and
a second comparator configured to compare the voltage stored in the second capacitor with the reference voltage to generate the second comparison signal.

6. The circuit of claim 4,
wherein the control signal generating unit is configured to determine a logic level of the first control signal and a logic level of the second control signal according to a logic level of the first comparison signal and a logic level of the second comparison signal.

7. The circuit of claim 6,
wherein the control signal generating unit is configured to output the first control signal and the second control signal, the first and second control signals having different logic levels from each other.

8. The circuit of claim 7,
wherein the control signal generating unit comprises a comparator configured to receive the first comparison signal and the second comparison signal to output the first control signal and the second control signal.

9. The circuit of claim 4,
wherein the control unit is configured to receive the reference current, the first control signal, and the second control signal to control the first and second capacitors.

10. The circuit of claim 9,
wherein the control unit comprises:
a first capacitor control unit configured to charge the first capacitor by outputting the reference current according to the first control signal or to discharge the first capacitor by connecting the first capacitor to a ground terminal; and
a second capacitor control unit configured to charge the second capacitor by outputting the reference current according to the second control signal or to discharge the second capacitor by connecting the second capacitor to a ground terminal.

11. The circuit of claim 10,
wherein the first capacitor control unit comprises:
a charging unit configured to output the reference current in response to the first control signal; and
a discharging unit configured to control a connection status of the ground terminal in response to the first control signal.

12. The circuit of claim 11,
wherein the charging unit and the discharging unit comprise transistors.

13. The circuit of claim 10,
wherein the second capacitor control unit comprises:
a charging unit configured to output the reference current in response to the second control signal; and a discharging unit configured to control a connection status of the ground terminal in response to the second control signal.

14. The circuit of claim 13, wherein the charging unit and the discharging unit comprise transistors.

15. The circuit of claim 10, wherein when the first capacitor control unit is configured to charge the first capacitor, the second capacitor control unit is configured to discharge the second capacitor, and when the first capacitor control unit discharges the first capacitor, the second capacitor control unit charges the second capacitor.

16. The circuit of claim 1, wherein the control signal generator is configured to generate a plurality of current control signals.

17. The circuit of claim 16, wherein whether the plurality of current control signals generated by the control signal generator are activated or not is determined according to connection statuses of fuses.

18. The circuit of claim 1; wherein each of the fixed current generating units comprises: a first transistor comprising a drain terminal, a gate terminal to which the positive temperature coefficient voltage is applied and a source terminal to which the external voltage is applied; and a second transistor comprising a gate terminal to which the negative temperature coefficient voltage is applied, a source terminal to which the external voltage is applied, and a drain terminal connected to the drain terminal of the first transistor.

* * * * *